US010149373B2

(12) United States Patent
Adenau

(10) Patent No.: US 10,149,373 B2
(45) Date of Patent: Dec. 4, 2018

(54) LIGHTING CONTROL CONSOLE HAVING A DUAL ENCODER

(71) Applicant: MA Lighting Technology GmbH, Waldbüttelbrunn (DE)

(72) Inventor: Michael Adenau, Würzburg (DE)

(73) Assignee: MA LIGHTING TECHNOLOGY GMBH, Waldbüttelbrunn (DE)

( * ) Notice: Subject to any disclaimer, the term of this patent is extended or adjusted under 35 U.S.C. 154(b) by 0 days.

(21) Appl. No.: 15/870,086

(22) Filed: Jan. 12, 2018

(65) Prior Publication Data

US 2018/0206310 A1    Jul. 19, 2018

(30) Foreign Application Priority Data

Jan. 18, 2017   (DE) .................... 20 2017 100 249 U

(51) Int. Cl.
| | |
|---|---|
| *H05B 37/02* | (2006.01) |
| *H01H 15/10* | (2006.01) |
| *G05G 1/08* | (2006.01) |
| *G05G 13/00* | (2006.01) |
| *G01D 5/14* | (2006.01) |

(Continued)

(52) U.S. Cl.
CPC ......... *H05B 37/029* (2013.01); *G01D 5/142* (2013.01); *G01D 5/34* (2013.01); *G05G 1/08* (2013.01); *G05G 5/12* (2013.01); *G05G 13/00* (2013.01); *H01H 19/02* (2013.01); *H01H 36/02* (2013.01);

(Continued)

(58) Field of Classification Search
USPC ....... 315/151–153, 291, 297, 308, 312, 316, 315/320
See application file for complete search history.

(56) References Cited

U.S. PATENT DOCUMENTS

| | | |
|---|---|---|
| 5,187,630 A | 2/1993 | MacKay et al. |
| 5,404,152 A | 4/1995 | Nagai |

(Continued)

FOREIGN PATENT DOCUMENTS

| | | |
|---|---|---|
| DE | 102014116827 A1 | 5/2016 |
| DE | 202016105915 U1 | 11/2016 |

(Continued)

OTHER PUBLICATIONS

European Patent Office, Search Report, Application No. EP 17 20 3554, dated May 15, 2018, 2 pages.

(Continued)

*Primary Examiner* — Jimmy Vu
(74) *Attorney, Agent, or Firm* — Quarles & Brady LLP

(57) ABSTRACT

A lighting control console for controlling a lighting system, wherein digital adjusting commands are generated in the lighting control console that can be transmitted to the lighting system via data links. At least one dual encoder is provided in the control panel of the lighting control console which allows users to enter input values. The dual encoder includes a first shaft and a second shaft rotatably mounted in a housing, first and second locking mechanisms for locking different rotational positions of the first and second shafts, and at least one first and at least one second rotation signal generator for generating a data signal showing a switchover between two locking positions. Both shafts include actuating elements at which adjusting movements can be transmitted onto the shafts by hand.

16 Claims, 7 Drawing Sheets

(51) Int. Cl.
  *G01D 5/34* (2006.01)
  *G05G 5/12* (2006.01)
  *H01H 19/02* (2006.01)
  *H01H 36/02* (2006.01)
  *H01H 19/60* (2006.01)

(52) U.S. Cl.
  CPC ......... *H05B 37/02* (2013.01); *G05G 2505/00* (2013.01); *H01H 19/60* (2013.01)

(56) References Cited

U.S. PATENT DOCUMENTS

| 8,138,689 | B2* | 3/2012 | Adenau | H05B 37/0254 315/292 |
| 2004/0210916 | A1 | 10/2004 | Hori | |
| 2010/0238200 | A1 | 9/2010 | Adenau | |
| 2012/0186951 | A1 | 7/2012 | Wu et al. | |
| 2016/0138943 | A1 | 5/2016 | Jordens et al. | |
| 2018/0113608 | A1 | 4/2018 | Adenau et al. | |

FOREIGN PATENT DOCUMENTS

| EP | 0752632 | A2 | 1/1997 |
| EP | 1544880 | A2 | 6/2005 |
| WO | 9423273 | A1 | 10/1994 |

OTHER PUBLICATIONS

PCT International Search Report, PCT/EP2017/082633, dated May 16, 2018, 3 pages.

* cited by examiner

LIGHTING CONTROL CONSOLE HAVING A DUAL ENCODER

CROSS-REFERENCE TO RELATED APPLICATIONS

This application claims priority to German Utility Model Application No. 20 2017 100 249.7 filed on Jan. 18, 2017. The contents of the priority application are hereby incorporated by reference as if set forth in their entirety herein.

BACKGROUND

Generic lighting control consoles serve for controlling lighting systems such as those employed in theaters or on concert stages, for instance. Routinely, said lighting systems comprise a plurality of lighting devices, for instance stage spotlights, wherein the lighting devices on their own in many cases can also be switched between a plurality of lighting states, for instance between different colors. These different lighting states are stored and controlled in the lighting program of the lighting control console by way of programmed parameters. Here, standard lighting systems may comprise up to several thousand lighting devices. In order to be able to control such complex lighting systems, the generic lighting control consoles are equipped with a digital processor, which permits digital data and signal processing. For storing the data, a digital memory is further provided, which in particular allows for archiving of lighting programs.

For programming the lighting program or for controlling the lighting program while it is running, operators have to enter control commands as input values. Said control commands can, for instance, be the selection of a specific lighting device or the setting of a specific parameter. For entering these control commands, mechanical control elements, for instance key buttons, rotary controls or slide controls, are available at known lighting control consoles. Here, the control commands being assigned to the individual control elements may be altered by way of suitable menu changeovers in order to be able to program and control correspondingly complex lighting programs.

Dual encoders are input apparatuses, which allow users to enter an assigned electrical signal by turning an actuating element. Here, dual encoders are characterized in that they do not only include one actuating element, for instance a rotary knob or a rotary disk, but two actuating elements. Here, both actuating elements are connected to a shaft being mounted so as to be rotatable. One rotation signal generator, which is able to directly or indirectly detect a turning of the shaft, is assigned to each shaft. In each instance, the two rotation signal generators then generate an electrical signal after having detected an adjusting movement at the shaft.

Besides, the two shafts are equipped with one locking mechanism in each instance, which mechanism is able to lock the shafts in different rotational positions. In this manner, the signals having been generated by the rotation signal generator can show a switchover between two locking positions by turning the shaft.

For instance, but by no means exclusively, known dual encoders may be used for entering two adjusting values at an appliance, for instance the X value and the Y value in a Cartesian coordinate system, with discrete rates in each instance, with only minor adjusting movements of the hand. From document DE 33 36 746 A1, a simple encoder is known, which is embodied in the manner of a rotary switch. Said encoder has a mechanical locking mechanism, which is able to fix the shaft in different locking positions. Said mechanical locking mechanism has the disadvantage that the mechanical connections of the locking mechanism are subject to relatively high wear, due to which the locking mechanism becomes sluggish or fails completely after a certain running time.

SUMMARY

Starting from this state of the art, it is therefore the object of the present invention to propose a novel lighting control console having a dual encoder, the locking mechanisms of which lighting control console work largely without any wear for fixing the rotatable shafts in different rotational positions.

Advantageous embodiments of the invention are the subject-matter of the dependent claims.

The lighting control console in accordance with the invention, in the control panel, is equipped with at least one dual encoder for entering input values. The invention is based on the fundamental idea that both shafts of the dual encoder, wherein users at said shafts, by hand, put in their adjusting movements at the dual encoder, are equipped with a magnetic locking mechanism, such that, owing to the fact that the magnetic locking mechanisms function in a non-contact fashion, no substantial wear arises at the locking mechanisms. To be specific, this is achieved in terms of the design in that one locking ring is arranged at each of the two shafts for co-rotation, the locking rings being made of a magnetizable material. Here, radial extensions are in each instance provided at the outer circumference of the two locking rings, such that the outer circumference alternates between a maximum value at the outer end of the radial extensions and a minimum value, namely at the grooves between the radial extensions. This changing outer circumference of the locking ring, for forming a hermetical locking mechanism, is now used in that a magnet is arranged in the housing, being opposite to the radial extensions. If a radial extension is now directly opposite to the magnet, the width of the air gap between the corresponding locking ring and the magnet is at a minimum, such that the holding force being exerted on the locking ring by the magnetic flux of the magnet assumes a maximum value. If, in contrast, a groove of the locking ring is opposite to the magnet, the magnetic flux of the magnet drops due to the locking ring, and the holding force being exerted on the locking ring sinks to a minimum value. In other words, this means that, due to the variation of the width of the air gap between the magnet on the one hand and the locking rings on the other hand, which variation is caused by the variation of the outer circumference of the locking ring with its radial extensions, the magnetic flux being exerted on the locking ring by the magnet can be varied owing to the change in the width of the air gap. Due to said change in the magnetic flux and in the magnetic holding force being exerted thereby, the magnet brings about a locking of the respectively assigned shaft in the housing, the locking depending on the rotational position.

In order to allow for a particularly compact construction of the dual encoder, it is particularly advantageous if the two shafts run coaxially with respect to each other. In order to make this possible, one of the two shafts is embodied in the manner of a hollow shaft, which, with at least one roller bearing, is mounted in the housing of the dual encoder so as to be rotatable. In said hollow shaft, the second shaft, with at least one further roller bearing, is then in turn mounted so as to be rotatable. In this manner, users are able to turn both shafts independently of each other, in order to be able to configure corresponding settings by means of the dual encoder.

A particularly simple and cost-effective structure of the dual encoder results if the two locking rings present the same outer circumference with their radial extensions and if they are arranged, in the direction of the longitudinal axis of the shafts, behind each other in the housing. The magnet for realizing the two locking mechanisms is arranged in the housing of the dual encoder such that it is centrally opposite to the gap between the two locking rings. In this manner, a magnet can simultaneously build up a magnetic flux at both locking rings. For realizing the two locking mechanisms at the two locking rings, a single magnet, which acts on both locking rings at the same time, is therefore already sufficient.

The magnetic holding force of the magnet being utilized in the locking mechanism exerts a magnetic pull on the locking rings, such that a tilting moment in each instance acts on the two shafts. In order to compensate for this tilting moment and in order to thereby prevent wear of the bearing of the shafts, it is particularly advantageous if, for realizing the locking mechanisms, two magnets are in each instance arranged in the housing, mirror-symmetrically with respect to the longitudinal axis of the shafts. In this manner, the tilting moment of the two magnets acts on the shafts with opposite signs, thereby being obliterated as a result. Depending on the function of the dual encoder, it may be desirable for the locking of the two locking mechanisms to present a different locking resistance. Such locking mechanisms having different locking resistances can, in the dual encoder, be realized in a simple manner in that at least one magnet is in each instance exclusively assigned to each of the two locking rings, wherein the different magnets act on the locking rings of the two shafts with a different magnetic holding force in each instance. For instance, a small, relatively weak magnet can be assigned to one of the locking rings, in order to realize a weak locking, whereas the second locking ring cooperates with a stronger and larger magnet in order to realize a stronger locking.

It is in principle arbitrary which type of rotation signal generator is employed for detecting the adjusting movements at the two shafts. With regard to a resistance to wear that is as high as possible, it is particularly advantageous if a rotation signal generator that works in a noncontact fashion, in particular a reflective light barrier or a Hall effect sensor, is employed. Here, the design of the dual encoder is simplified considerably if said dual encoder that works in a noncontact fashion detects the adjusting movements of the radial extensions at the locking rings for generating the switchover signal between two locking positions. In other words, this means that the radial extensions at the locking rings do not only serve for forming the magnetic locking mechanism, but are at the same time also used for detecting the adjusting movements at the shafts of the dual encoder.

In different areas of application of dual encoders, it is furthermore important, apart from generating a switchover signal, when adjusting between two locking positions, to also detect the rotational direction of the corresponding shaft. In order to avoid installing a specific rotational direction sensor, two rotation signal generators can be assigned to each of the locking rings. When evaluating the switchover signals of the two rotation signal generators being assigned to one locking ring, phase shifts occur between the switchover signals, which shifts indicate the rotational direction of the assigned locking ring. If one of the rotation signal generators is, for instance, arranged in the housing so as to be slightly offset clockwise with respect to the second rotation signal generator, it can without any problems be detected from the phase shift of the two rotation signal generators in which direction the locking ring rotates.

For specific functions, it is advantageous that, after setting one of the two shafts of the dual encoder, for instance for selecting an X or a Y value, users can select and confirm the corresponding value. Said selection and confirmation of a value having been set at the shafts can in a simple manner be realized in that at least one of the two shafts is mounted so as to be axially adjustable in the direction of its longitudinal axis between a rest position and a switched position. Hence, this means that the shaft is not only mounted so as to be rotatable, but also so as to be axially adjustable. In order to then realize the selection and confirmation of a set value, a switching sensor is additionally provided in the housing, with which sensor the adjustment of the axially adjustable shaft between the rest position and the switched position can be detected. If the users have now set a specific value by turning the shaft, which can be analyzed electronically by evaluating the signals of the rotation signal generator, the users can then push the axially adjustable shaft for a short time and can thereby move it from its rest position into the switched position. This adjustment can then be detected with the aid of the switching sensor, such that the value having been set at the shaft is thus selected and confirmed by the users and can be made available for further electronic processing.

With regard to the resistance to wear of the dual encoder, it is in turn particularly advantageous if the switching sensor is also embodied as a switching sensor that works in a noncontact fashion, in particular as a reflective light barrier or as a Hall effect sensor.

With regard to a simple and reliable signal evaluation of the switching sensor, a signaling disk can additionally be fastened to the axially adjustable shaft. Said signaling disk can be arranged so as to be opposite to the switching sensor that works in a noncontact fashion, said sensor for instance being a reflective light barrier. By adjusting the axially adjustable shaft between its rest position and the switched position, the signaling disk then reaches a position in which the distance between the switching sensor and the signaling disk becomes significantly smaller or larger, in order to thus be analyzable without any problems by the switching sensor working in a noncontact fashion, said sensor for instance being a reflective light barrier or a Hall effect sensor.

In order to realize the function of the dual encoder in connection with an axially adjustable mounting of at least one shaft, it is required that the axially adjustable shaft, under normal circumstances without any effort on the part of the users, is held in its rest position. With regard to an operation of the dual encoder that is as free from wear as possible, this readjusting of the axially adjustable shaft into its rest position can be realized by way of a readjusting magnet. Said readjusting magnet, too, with its readjusting force, acts on the assigned components of the axially adjustable shaft in a noncontact fashion.

With regard to ease of operation and to a wear that is as low as possible, it is besides advantageous if the adjusting movement of the axially adjustable shaft between the rest position and the switched position or vice versa is dampened. Hereunto, a dampening element, for instance a rubber ring, can be utilized, which, in a dampening fashion, may come to rest against a component of the shaft being mounted so as to be adjustable.

With regard to a simple handling when entering values at the inventive lighting control console having the dual encoder when programming the lighting control console, it is particularly advantageous if the actuating elements are embodied in the manner of rotary knobs or of rotary disks for hand-activated adjustment of the shafts, said knobs or disks being arranged in the control panel of the lighting control console. Here, the two rotary knobs or rotary disks of the dual encoder are arranged one on top of the other in the direction of the longitudinal axis of the shafts and can coaxially be turned in opposite directions, such that users can set both actuating elements without any problems solely by moving their fingers.

The magnetically acting locking mechanism at the two shafts of the dual encoder works in a noncontact fashion, such that, when adjusting the shafts, substantially no frictional losses arise. In order to allow for an adjustment of the shafts by way of an angular momentum induced by users at the actuating element being assigned in each instance, it is particularly advantageous if the corresponding actuating element is equipped with a weight. Due to said weight, it is possible to transmit a greater angular momentum onto the actuating element, such that the corresponding shaft of the dual encoder lags behind for a correspondingly long time and allows for a comfortable adjustment over long adjustment paths.

It is in principle arbitrary which type of magnet is utilized for the locking mechanism of the dual encoder. The structure of the locking mechanism can be realized in a particularly simple, reliable and inexpensive fashion when permanent magnets are utilized.

As an alternative to permanent magnets, electromagnets can also be employed in the locking mechanism. By changing or switching off the energy supply of the electromagnet, the magnetic holding force acting in the locking mechanism can be changed depending on its function.

The device according to the invention serves in particular for using a method for entering input values at the inventive lighting control console having a dual encoder. The method is characterized in that two input values can be entered very quickly without moving the hand on the control panel. Hereunto, it is envisaged in accordance with the method that the first shaft is initially turned, and that the first input value is identified by evaluating the data signals of the first rotation signal generator having been generated thereby. Subsequently, users can then turn the second shaft of the dual encoder, wherein the second input value is identified by evaluating the data signals of the second rotation signal generator having been generated thereby. This type of input is in particular advantageous in such cases where the two input values form a pair of input values, which pair is supposed to be made available for further processing together. Since users do not have to move their hands in the control panel when entering the two input values, the input process is accelerated all in all and ease of use is increased for operators at the same time.

It is in principle arbitrary which sorts of input values are entered into the lighting control console with the aid of the method in accordance with the invention. In accordance with a first embodiment variant, it is envisaged that, by evaluating the first rotation signal generator, an X coordinate value of a table is entered and, by evaluating the second rotation signal generator, a Y coordinate value of the same table is entered. In this manner, users can move very fast in tables containing values and can move to a cell they have searched in the table.

Alternatively, the method can also be used to enter movement adjusting commands into the lighting control console in a simple and comfortable fashion. By rotating the first shaft, the first movement adjusting command, for instance a pan value of a correspondingly adjustable lamp, is entered and by rotating the second shaft, a second movement adjusting command, for instance the tilt value of said lamp, is entered.

In accordance with a further variant, the dual encoder is used to successively enter, initially, a coarse value of a scale of values and then a precise value in the same scale of values. By rotating the first shaft the coarse value of the scale is initially actuated and then, by rotating the second shaft, a precise value is entered starting from the coarse value.

At generic lighting control consoles, large command menus are in many cases available, through which menus users have to move during programming. In order to facilitate actuation of specific commands in the command menu, this corresponding adjusting movement through the command menu can be facilitated by means of use of the dual encoder in accordance with the invention. By rotating the first shaft, users then scroll through the command menu vertically and by rotating the second shaft, they can cause a horizontal movement through the command menu.

As far as the dual encoder of the lighting control console in accordance with the invention is equipped with an axially adjustable shaft and with a corresponding switching sensor, the input values having been set by turning the two shafts can in a simple manner be made available for further processing. In accordance with a particular method variant, this takes place in that, after setting the two input values by turning the two shafts, the axially adjustable shaft is pushed and the data signal of the Hall effect sensor having been generated thereby is evaluated. As soon as the corresponding data signal is received from the Hall effect sensor, the input values having been set at the two shafts are read out and are made available for further processing in the lighting control console.

Apart from the possible areas of application of the method already having been mentioned, by using the dual encoder, it is also possible to facilitate or accelerate entering various other data. In this way, when entering colors, two colors can be mixed or the color temperature can be changed. It is also possible to simultaneously set two gobo wheels by turning the shafts. Actions such as dimming, zooming and focusing or setting the speed and starting angle of rotary motions are conceivable.

In the drawings, one embodiment of the invention is schematically illustrated and will be explained by way of example in the following.

DETAILED DESCRIPTION

Figure 1:
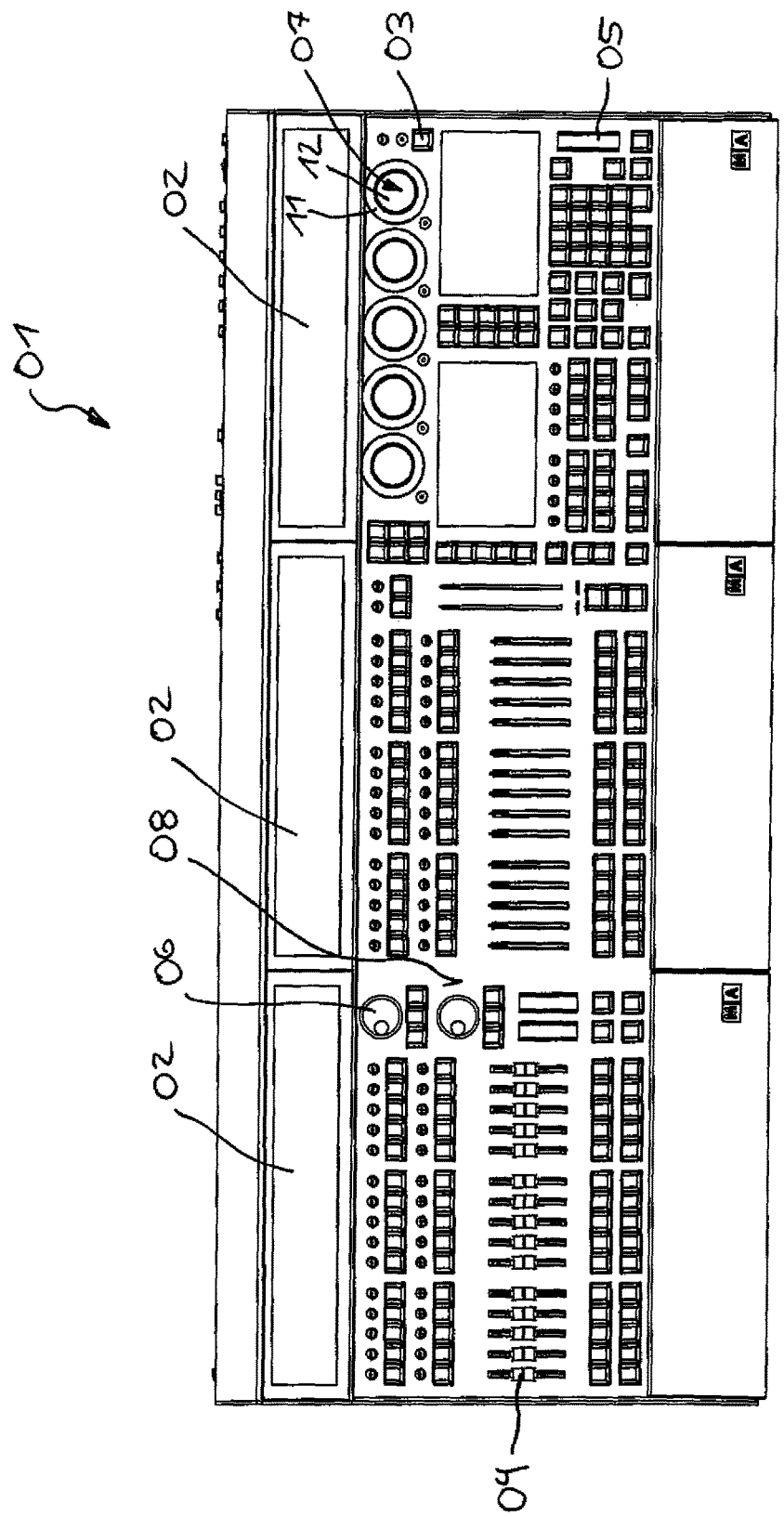
FIG. 1 shows a lighting control console having two dual encoders in a perspective view from above.

In a perspective view, FIG. 1 shows a lighting control console 01 in accordance with the invention for programming and controlling a stage lighting system. The lighting control console 01 is equipped with three monitors 02 for displaying various menus for users. For entering adjusting commands, a plurality of push buttons 03, slide controls 04 and adjusting wheels 05 is provided at the lighting control console 01. Besides, for entering control commands, the control panel 08 of the lighting control console 01 is fitted with five simple rotary shaft encoders 06 and two dual encoders 07.

Figure 2:
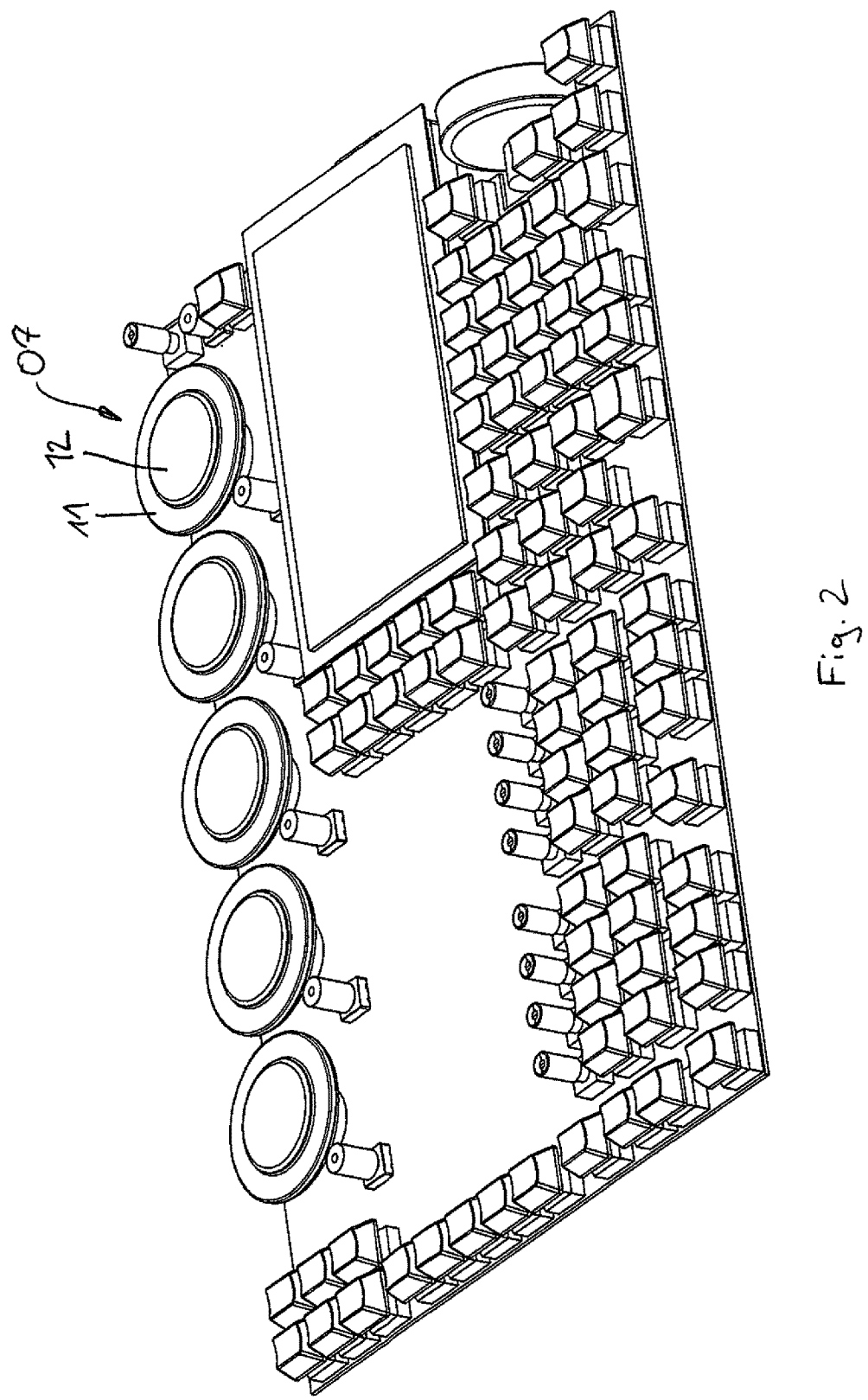
FIG. 2 shows the electronic circuit board of the lighting control console in accordance with FIG. 1, the dual encoders being mounted on the electronic circuit board, in a perspective view from above.

FIG. 2 shows the electronic circuit board of the lighting control console in accordance with FIG. 1, the dual encoders being mounted on the electronic circuit board, in a perspective view from above.

Figure 3:
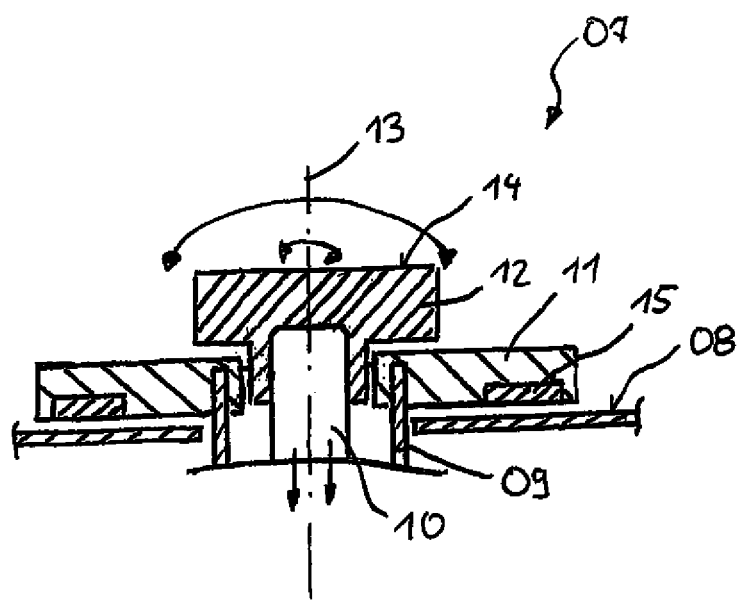
FIG. 3 shows the actuating elements at a dual encoder of the lighting control console in accordance with FIG. 1 in a cross-section.

FIG. 3 shows the upper part of a dual encoder 07 in a cross-section. The dual encoder with which the control panel 08 of the lighting control console 01 is fitted includes two shafts being mounted so as to be rotatable, namely a hollow shaft 09 and a central shaft 10 being mounted therein so as to be coaxially rotatable. In FIG. 3, only the upper ends of the hollow shaft 09 and of the central shaft 10 are illustrated. The function of the hollow shaft 09 and of the central shaft 10 is explained below with the aid of the other drawings. Two actuating elements, namely a rotary disk 11, with which the hollow shaft 09 can be turned, and a rotary knob 12, with which the central shaft 10 can be turned, are fastened to the upper ends of the hollow shaft 09 and of the central shaft 10.

Through manual actuating of the rotary disk 11 or of the rotary knob 12, the hollow shaft 09 and the central shaft 10 can be turned rotatorily about their longitudinal axis 13 independently of each other, in order to thereby enter adjusting commands into the lighting control console 01. Here, the hollow shaft 09 is additionally mounted so as to be axially adjustable in the direction of the longitudinal axis 13, such that users, by pressing onto the upper side 14 of the rotary knob 12, can select and confirm a value having been set by turning the hollow shaft 09. At its bottom side, the rotary disk 11 is equipped with an annular weight 15, which, for instance, may be produced by way of injection of a metal ring into the rotary disk 11 that consists of plastic material. Due to the fact that there is additional weight because of the weight 15, a greater angular momentum can be transmitted onto the rotary disk 11. This gives users the possibility to give momentum to the rotary disk 11 with their fingers and to thereby realize a strong rotary movement of the rotary disk 11.

Figure 4:
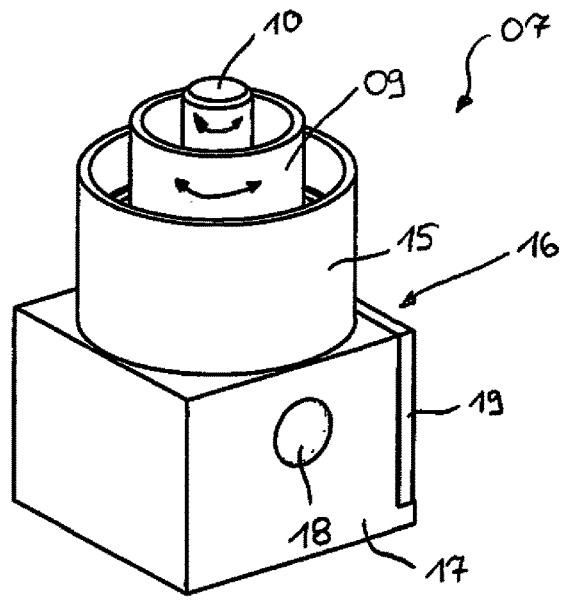
FIG. 4 shows the dual encoder of the lighting control console in accordance with FIG. 1 in a perspective lateral view.

FIG. 4 shows the dual encoder 07 having the shafts 09 and 10 being mounted so as to be rotatable in a perspective lateral view. The hollow shaft 09 is mounted in the cylindrical upper part 15 of the housing 16 so as to be rotatable. The central shaft 10 is mounted in the hollow shaft 09 so as to be rotatable. A rectangular lower part 17 adjoins the upper part 15 of the housing 16, which lower part serves for fastening the magnets of the magnetically acting locking mechanism, namely two permanent magnets 18, and one electronic baseboard 19, on the inner side of which the sensors of the dual encoder 07 are arranged.

Figure 5:
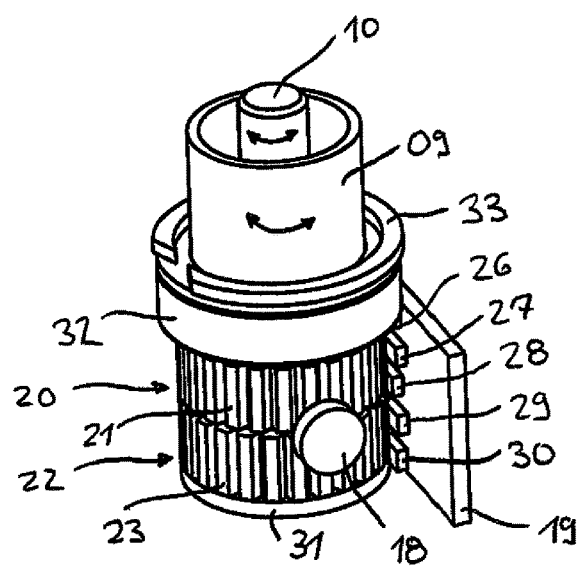
FIG. 5 shows the dual encoder in accordance with FIG. 3 omitting the housing, in a perspective lateral view.

FIG. 5 shows the dual encoder 07 without the housing 16. A first locking ring 20 is fastened to the hollow shaft 09, at the outer circumference of which locking ring radial extensions 21 extend towards the outside in each instance. A locking ring 22 having radial extensions 23 and being substantially identically constructed is fastened to the central shaft 10. The two locking rings 20 and 22 are located, in the fitting position, directly on top of each other and, for realizing a magnetic locking mechanism, cooperate with the permanent magnet 18 and with a second permanent magnet 18 being attached to the opposite side of the housing 16 in a mirror-symmetrical fashion. The mirror-symmetrical arrangement of the two permanent magnets 18 can be seen from the sectional illustration in FIG. 9. Both permanent magnets 18 are arranged in the housing 16 such that they are centrally opposite to the gap 24 between the two locking rings 20 and 22. In this manner, the two permanent magnets 18 can cooperate both with the radial extensions 21 and with the radial extensions 23 of the two locking rings 20 and 22 for realizing the magnetic locking mechanism. Owing to the change in the outer circumference of the locking rings 20 and 22 corresponding to the height of the radial extensions 21 and 22, the width of the air gap 25 between the permanent magnets 18 on the one hand and the locking rings 20 or 22 on the other hand changes. In a small air gap 25, the permanent magnets 18 bring about a high magnetic flux through the magnetic material of the locking rings 20 and 22 and a correspondingly high locking force. If the air gap 25 is then increased in size by turning the shaft 09 or 10, a reduction in the magnetic locking force follows, such that, as a result, the locking force of the permanent magnets 18, which is exerted on the locking rings 20 and 22, alternates between a force maximum and a force minimum, thereby realizing the desired locking effect at the shafts 09 and 10 of the dual encoder 07.

On the inner side, four rotation signal generators 26, 27, 28 and 29 are fastened and contacted electronically on the baseboard 19. The rotation signal generators 26 to 29 are embodied in the manner of Hall effect sensors and cooperate with the radial extensions 21 or 23 of the locking rings 20 and 22 for detecting the switchover between two locking positions. Here, the rotation signal generators 26 and 27 are assigned to locking ring 20 and the rotation signal generators 28 and 29 are assigned to locking ring 22. By means of the starting signals from the rotation signal generators 26 to 29 and by analyzing the phase shift of rotation signal generator 27 in relation to rotation signal generator 26 or of rotation signal generator 29 in relation to rotation signal generator 28, the adjustment of the locking rings 20 and 22 and the rotational direction can be detected.

Figure 8:
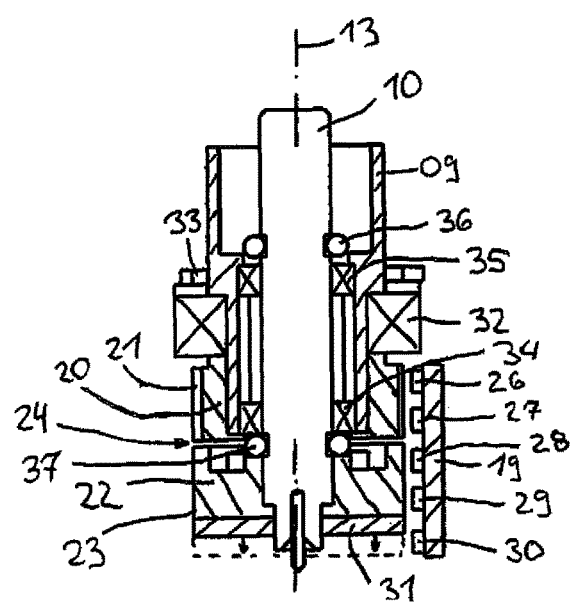
FIG. 8 shows the dual encoder in accordance with FIG. 6 in a cross-section along sectional line I-I omitting the housing surrounding the same.

Furthermore, an additional switching sensor 30, which is similarly embodied in the manner of a Hall effect sensor working in a noncontact fashion, is fastened and electronically contacted on the baseboard 19. Here, the switching sensor 30 cooperates with a signaling disk 31, which is fastened to the central shaft 10 beneath the locking ring 22. If the axially adjustable central shaft 10 is in its axial rest position, as it is illustrated in FIG. 8, the signaling disk 31 is located above the switching sensor 30. If users then push the central shaft 10 axially downwards for confirming a previously set value, the central shaft 10 reaches its switched position, in which the signaling disk 31 is directly opposite to the switching sensor 30 (as it is indicated by a dashed line in FIG. 8).

Figure 6:
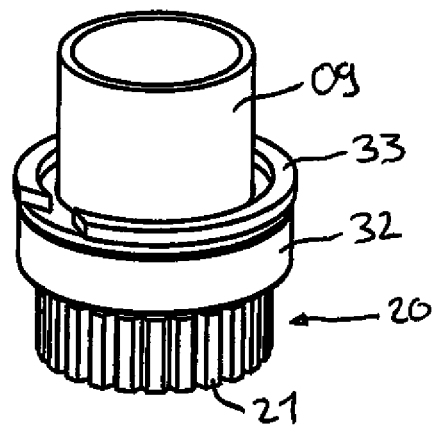
FIG. 6 shows the two shafts of the dual encoder, said shafts being mounted so as to be rotatable, in accordance with FIG. 3 in a perspective exploded drawing.
Figure 6:
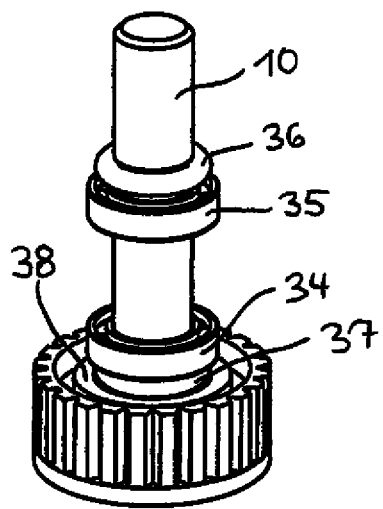

FIG. 6 shows the two shafts 09 and 10 having the locking rings 20 and 22 being fastened thereto in each instance, without the housing 16, in an exploded illustration. By means of a roller bearing 32, the hollow shaft 09 is held in the cylindrical upper part 15 of the housing 16 so as to be rotatable. A snap ring 33 serves for fastening the roller bearing 32 having the hollow shaft 09 in the housing 16.

The central shaft 10, having two roller bearings 34 and 35, is mounted in the inside of the hollow shaft 09 so as to be rotatable and axially adjustable. Two rubber rings 36 and 37 serve for dampening the axial adjusting movement of the central shaft 10. Besides, an annular readjusting magnet 38 is fastened to the upper side of the locking ring 22, the magnetic force of which magnet retracts the central shaft 10 into its rest position being illustrated in FIG. 7. When the users press onto the upper end of the shaft 10, the magnetic holding force of the readjusting magnet 38 is exceeded at a specific threshold and the shaft 10, having the locking ring 22 and the signaling disk 31, is axially adjusted into its switched position being shown in a dashed line.

Figure 7:
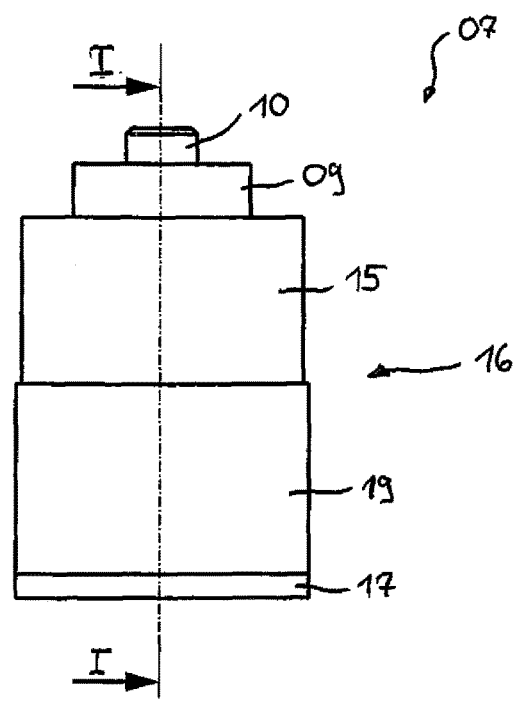
FIG. 7 shows the dual encoder in accordance with FIG. 3 in a first lateral view.

FIG. 7 shows the dual encoder in accordance with FIG. 3 in a first lateral view.

FIG. 8 shows the dual encoder in accordance with FIG. 6 in a cross-section along sectional line I-I omitting the housing surrounding the same.

Figure 9:
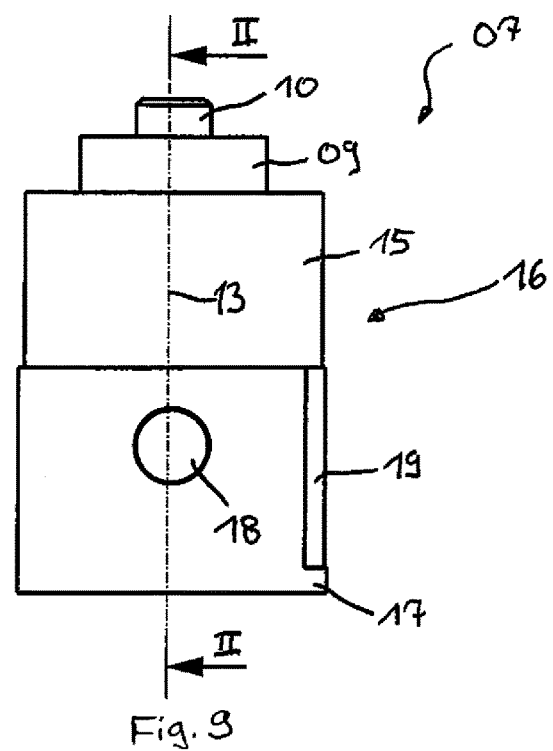
FIG. 9 shows the dual encoder in accordance with FIG. 3 in a second lateral view.

FIG. 9 shows the dual encoder in accordance with FIG. 3 in a second lateral view.

Figure 10:
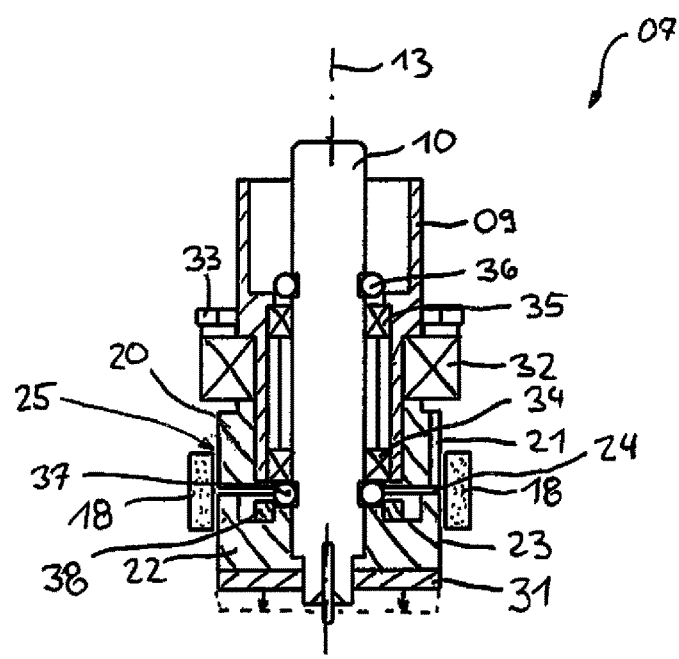
FIG. 10 shows the dual encoder in accordance with FIG. 8 in a cross-section along sectional line II-II.

FIG. 10 shows the dual encoder in accordance with FIG. 8 in a cross-section along sectional line II-II.

The invention claimed is:

1. A lighting control console for controlling a lighting system, wherein digital adjusting commands are generated in the lighting control console, which commands are transmitted to the lighting devices of the lighting system via data links, and wherein the lighting control console comprises at least one digital processor and at least one digital memory for generating, managing and storing the adjusting commands, and wherein the lighting control console comprises at least one display device, and wherein graphic elements are graphically depicted for users at the display device, wherein at least one dual encoder is provided in the control panel of the lighting control console, which dual encoder allows users to enter input values, wherein the dual encoder includes a first shaft being mounted in a housing so as to be rotatable, and wherein a first locking mechanism, for locking different rotational positions of the first shaft, and at least one first rotation signal generator, for generating a data signal showing a switchover between two locking positions, are provided at the first shaft, and wherein a second shaft mounted in the housing so as to be coaxially rotatable is provided at the dual encoder, and wherein a second locking mechanism for locking different rotational positions of the second shaft and at least one second rotation signal generator for generating a data signal showing a switchover between two locking positions are provided at the second shaft, and wherein both shafts include actuating elements, at which adjusting movements are transmitted onto the shafts by hand.

2. The lighting control console according to claim 1, wherein one locking ring is in each instance arranged at the first shaft and at the second shaft for co-rotation, the locking rings being made of a magnetizable material, wherein multiple radial extensions are in each instance provided at the outer circumference of the two locking rings, and wherein at least one magnet is arranged in the housing, being opposite to the radial extensions, and wherein the width of the air gap between the magnet on the one hand and the locking rings on the other hand varies, depending on the rotational position, between a maximum width and a minimum width, and wherein the magnetic holding force causes a locking of different rotational positions of the two shafts with respect to the housing, said holding force depending on the width of the air gap.

3. The lighting control console according to claim 1, wherein a shaft is embodied in the manner of a hollow shaft, which, with at least one roller bearing, is mounted in the housing so as to be rotatable, wherein the second shaft, with at least one further roller bearing, is mounted in the hollow shaft so as to be coaxially rotatable.

4. The lighting control console according to claim 1, wherein the two locking rings present the same outer circumference and are arranged, in the direction of the longitudinal axis of the shafts, behind each other in the housing, wherein the magnet is arranged in the housing so as to be centrally opposite to the gap between the locking rings, and wherein the magnetic holding force of the magnet simultaneously acts on both locking rings.

5. The lighting control console according to claim 1, wherein the rotation signal generators are embodied as rotation signal generators that work in a noncontact fashion, wherein the adjusting movements of the radial extensions at the locking rings, for generating the switchover signal between two locking positions, are detected with the aid of the rotation signal generator that works in a noncontact fashion.

6. The lighting control console according to claim 1, wherein two rotation signal generators are in each instance assigned to every locking ring, wherein the rotational direction of the assigned locking ring are detected from the phase shift of the switchover signal of the two rotation signal generators.

7. The lighting control console according to claim 1, wherein at least one shaft is mounted in the housing so as to be axially adjustable in the direction of its longitudinal axis between a rest position and a switched position, wherein a switching sensor is provided in the housing, with which sensor the rest position or switched position of the axially adjustable shaft are detected.

8. The lighting control console according to claim 7, wherein the switching sensor is embodied as a switching sensor that works in a noncontact fashion, wherein the adjusting movements of the axially adjustable shaft are detected indirectly or directly.

9. The lighting control console according to claim 7, wherein a signaling disk is fastened to the axially adjustable shaft, wherein the adjusting movements of the signaling disk are detected in a noncontact fashion with the aid of the switching sensor.

10. The lighting control console according to claim 7, wherein the axially adjustable shaft is held in the rest position with a readjusting magnet.

11. The lighting control console according to claim 7, wherein the adjusting movements of the axially adjustable shaft between the rest position and the switched position are dampened with the aid of at least one dampening element, in particular with the aid of a rubber ring.

12. The lighting control console according to claim 1, wherein the actuating elements are embodied in the manner of rotary knobs or of rotary disks for hand-activated adjustment of the shafts, which knobs or disks are arranged one on top of the other in the control panel of the lighting control console in the direction of the longitudinal axis of the shafts and coaxially are turned in opposite directions.

13. The lighting control console according to claim 12, wherein a weight is fastened to at least one actuating element.

14. The lighting control console according to claim 1, wherein the magnet of the locking mechanism is embodied in the manner of a permanent magnet or in the manner of an electromagnet.

15. The lighting control console according to claim 5, wherein the rotation signal generators comprise at least one of reflective light barriers or Hall effect sensors.

16. The lighting control console according to claim 8, wherein the switching sensor is at least one of a reflective light barrier and a Hall effect sensor.

\* \* \* \* \*